United States Patent
Jang et al.

(10) Patent No.: US 8,476,704 B2
(45) Date of Patent: Jul. 2, 2013

(54) CIRCUIT STRUCTURE WITH VERTICAL DOUBLE GATE

(75) Inventors: Jeng Hsing Jang, Kaohsiung (TW); Yi Nan Chen, Taipei (TW); Hsien Wen Liu, Luzhu Township, Taoyuan County (TW)

(73) Assignee: Nan Ya Technology Corporation, Tao-Yuan Hsien (TW)

( * ) Notice: Subject to any disclaimer, the term of this patent is extended or adjusted under 35 U.S.C. 154(b) by 193 days.

(21) Appl. No.: 13/213,786

(22) Filed: Aug. 19, 2011

(65) Prior Publication Data

US 2013/0043529 A1 Feb. 21, 2013

(51) Int. Cl.
*H01L 29/78* (2006.01)

(52) U.S. Cl.
USPC .................................. 257/334; 257/E29.262

(58) Field of Classification Search
USPC ................. 257/334, 302, 330, 331, 367, 383, 257/E29.262, E29.264, E27.092, E27.098
See application file for complete search history.

(56) References Cited

U.S. PATENT DOCUMENTS

| 4,683,643 | A | * | 8/1987 | Nakajima et al. | ............. | 438/270 |
| 6,008,083 | A | * | 12/1999 | Brabazon et al. | ............. | 438/239 |
| 2002/0030216 | A1 | * | 3/2002 | Adkisson et al. | ............. | 257/306 |
| 2005/0139887 | A1 | * | 6/2005 | Song | ............................. | 257/296 |
| 2011/0316169 | A1 | * | 12/2011 | Sunohara et al. | ............. | 257/774 |

* cited by examiner

*Primary Examiner* — Victor A Mandala
*Assistant Examiner* — Whitney T Moore
(74) *Attorney, Agent, or Firm* — Stites & Harbison PLLC; Juan Carlos A. Marquez, Esq.

(57) ABSTRACT

A circuit structure including a semiconductor substrate having a depression; a first insulating layer positioned on the surface of the depression; a bottom conductor positioned in a bottom portion of the depression, wherein the bottom conductor is connected to an external bias through a plurality of longer vertical contact plugs; an upper conductor positioned in an upper portion of the depression, wherein the upper conductor is connected to a plurality of shorter vertical contact plugs, and a top surface of the upper conductor is higher than a depression-bearing surface of the semiconductor substrate; and a second insulating layer positioned between the bottom conductor and the upper conductor.

13 Claims, 4 Drawing Sheets a circuit structure with vertical double gate, and more particularly, to a DRAM structure with recessed vertical double gate and vertical contact plugs.

CIRCUIT STRUCTURE WITH VERTICAL DOUBLE GATE

1. TECHNICAL FIELD

The present invention relates to a circuit structure with vertical double gate, and more particularly, to a DRAM structure with recessed vertical double gate and vertical contact plugs.

2. BACKGROUND

Semiconductor process technology has been continually scaling down in accordance with the prediction of Moore's law for the past four decades and the trend continues. Shrinking process geometries introduces new physical limitation in the small scale devices. DRAMs (dynamic random access memories) are one of the typical devices receiving great impact on reducing channel length. As the channel length is reduced to increase both the operation speed and the number of components per chip, the so-called short-channel effects arise. One of the physical phenomena attributed to the short-channel effects is the sub-threshold current leakage, and another well-known phenomenon generated by the same effect is the modification of the threshold voltage. The drain-induced barrier lowering (DIBL) contributes to the former phenomenon, wherein a reduction of the potential barrier eventually allows carriers flow between the source and the drain, even if the gate voltage is lower than the threshold voltage; the overestimation of the bulk charge that the gate voltage supports manifests on the threshold voltage shift in the short-channel structure and leads to a drifting threshold voltage that complicate both the control of device operation and the sub-threshold leakage problem. Further more, the small geometry device requires a stringent and precise manufacturing process to retain its reliability, a small window is opened for processing tolerance.

FIG. 1 is a cross-sectional view of a DRAM cell 10 with a conventional gate structure. Two sources 13 and one drain 15 are positioned in a semiconductor substrate 11. A conventional gate 17 is surrounded by a sidewall spacer 19 and is separated from the semiconductor substrate 11 by a thin gate oxide 18. In FIG. 1, two gates, two sources, and one drain form an active region which is further separated by shallow trench isolations (STIs) 12. A double arrow 14 shown in FIG. 1 indicates a channel length in the device structure, as the DRAMs scale down, this channel length becomes shorter and therefore other designs in gate structures are desired to alleviate the short channel effects. Several attempts have been made to mitigate the sub-threshold current leakage and the threshold voltage shift. For example, recessed gate devices were implemented to increase the channel length; devices with heavy channel implantation were also implemented to increase the threshold voltage. Nevertheless, heavy channel implantation effectively raises the threshold voltage, yet it inconvincibly sacrifices the structural integrity of the insulating layer, therefore generate a worse break down voltage.

SUMMARY

One aspect of the present invention discloses a circuit structure, comprising a semiconductor substrate having a depression; a first insulating layer positioned on the surface of the depression; a bottom conductor positioned in a bottom portion of the depression, wherein the bottom conductor is connected to an external bias through a plurality of longer vertical contact plugs; an upper conductor positioned in an upper portion of the depression, wherein the upper conductor is connected to a plurality of shorter vertical contact plugs, and a top surface of the upper conductor is higher than a depression-bearing surface of the semiconductor substrate; and a second insulating layer positioned between the bottom conductor and the upper conductor.

The foregoing has outlined rather broadly the features of the present invention in order that the detailed description of the invention that follows may be better understood. Additional features of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention are illustrated with the following description and upon reference to the accompanying drawings in which.

DETAILED DESCRIPTION

The structure disclosed in the present invention preserves the recessed gate design concept and add an extra degree of freedom on threshold voltage modulation by applying two external voltages to the vertical double gate structure. The present invention not only mitigate the sub-threshold current leakage issue but also grant the device manufacturing process a broader window of tolerance by providing a tuning mechanism to the threshold voltage after all the fabrication process.

Figure 1:
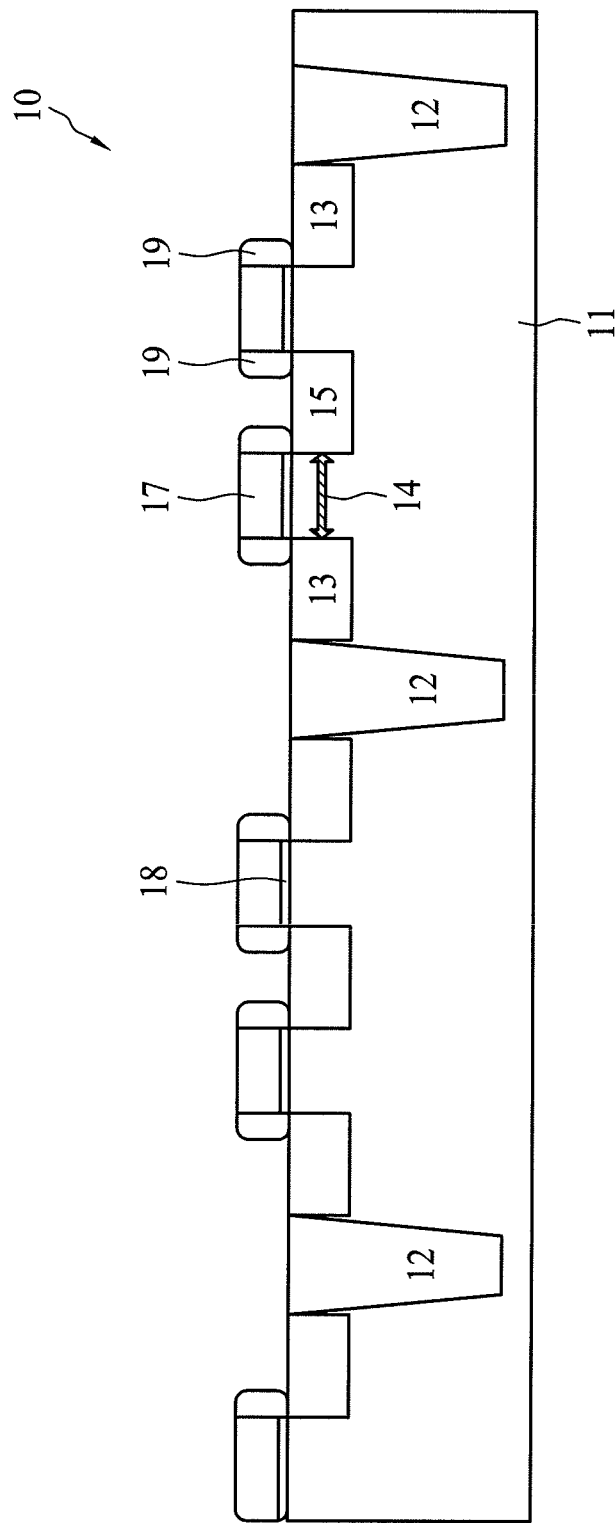
FIG. 1 is a cross-sectional view of a DRAM cell with a conventional gate structure.
Figure 2:
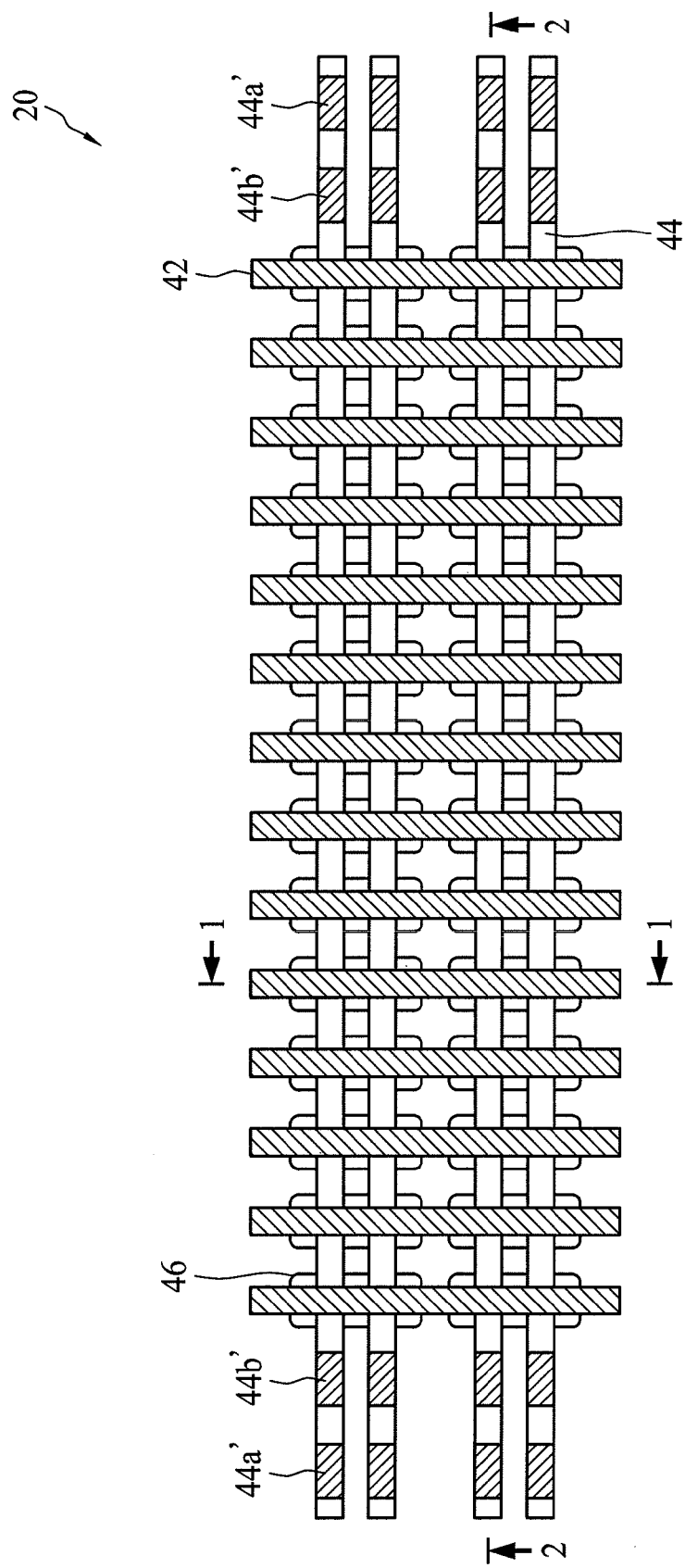
FIG. 2 shows a top view of a DRAM circuit layout containing horizontal word lines, vertical bit lines, and a plurality of active regions according to one embodiment of the present invention.
Figure 3:
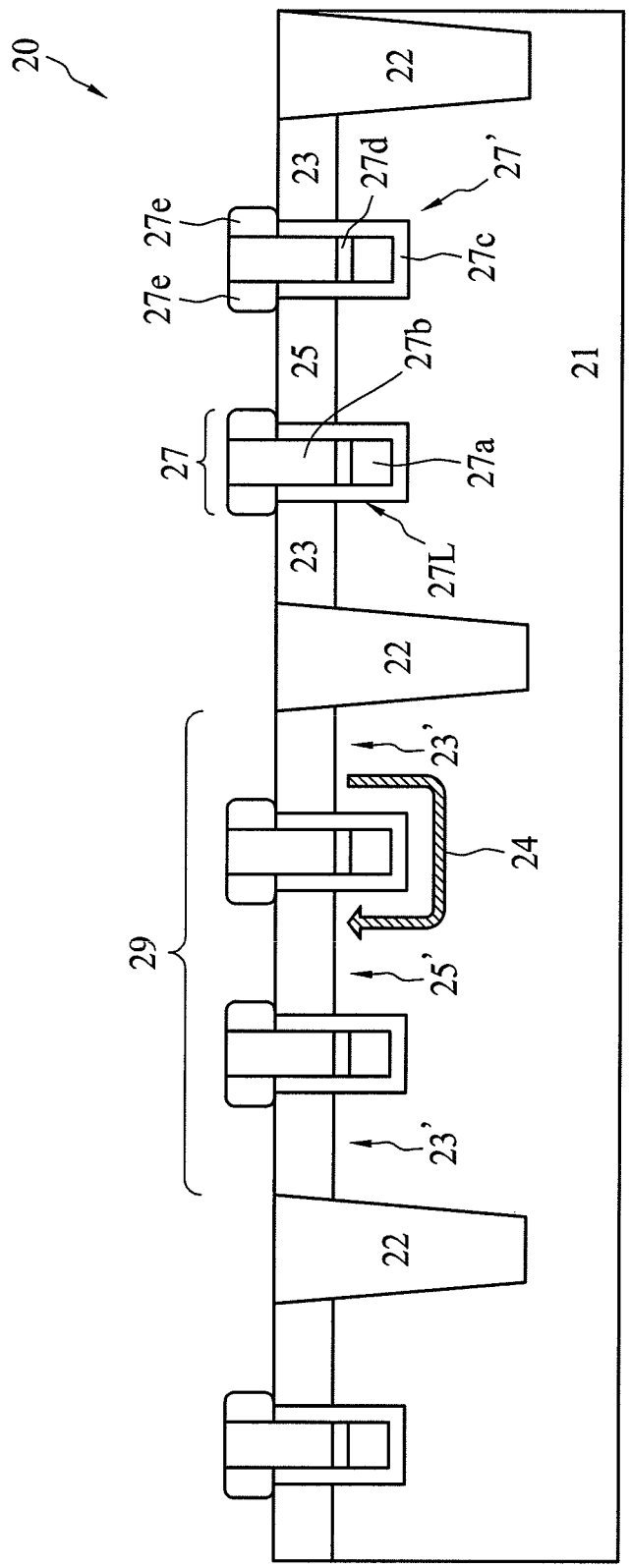
FIG. 3 and FIG. 4 are cross-sectional views along the cross-sectional line 1-1 and the cross-sectional line 2-2 respectively.
Figure 4:
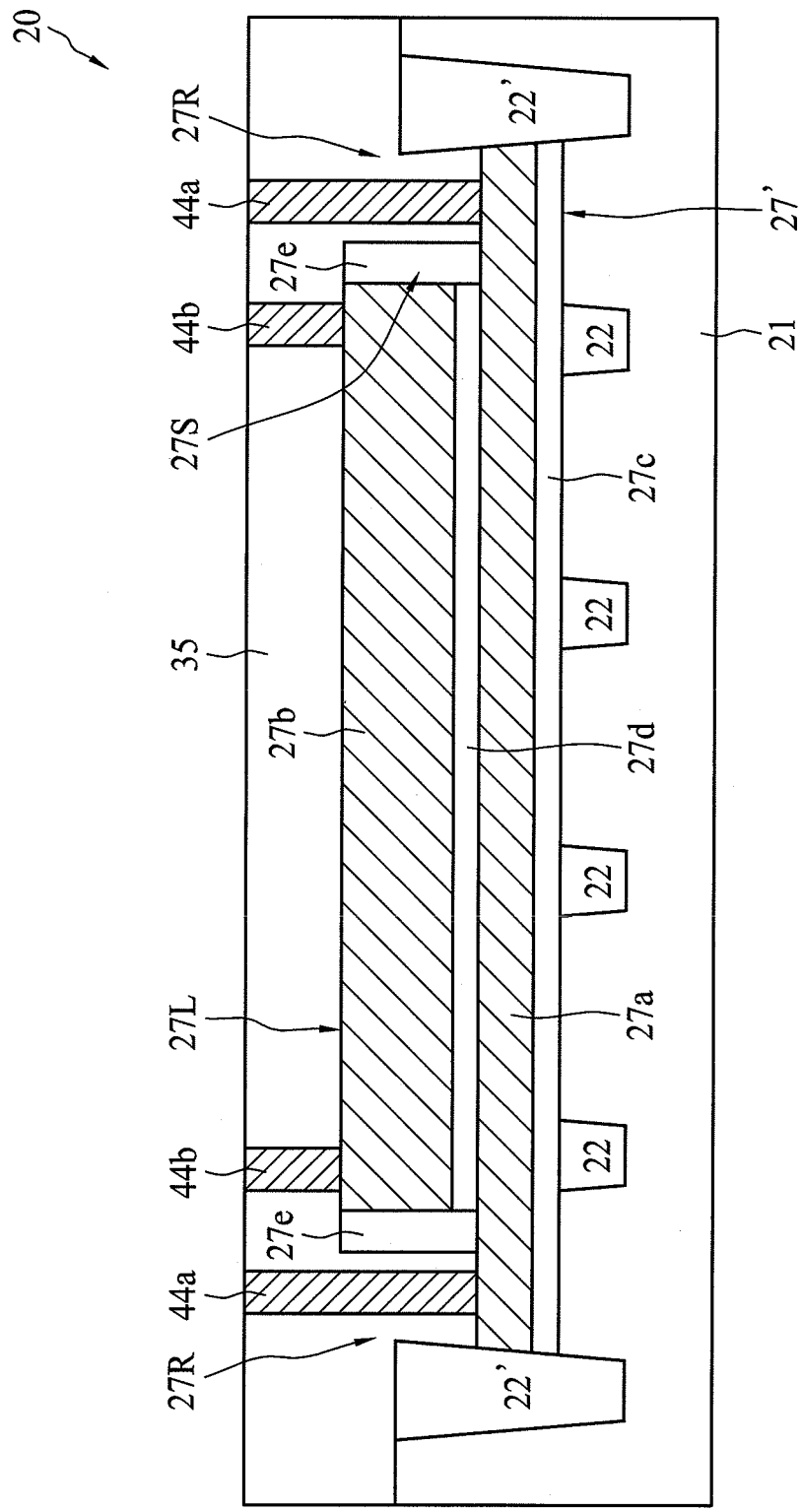

The present invention describes a circuit structure with recessed vertical double gate. Referring to FIG. 2, according to one embodiment of the present invention, the circuit structure 20 is specifically implemented in a DRAM circuit construct. Horizontal word lines 44 and vertical bit lines 42 are arranged in a staggered manner on top of a plurality of active regions 46. FIG. 3 and FIG. 4 are cross-sectional views along the cross-sectional line 1-1 and the cross-sectional line 2-2 respectively.

Referring to FIG. 3, the circuit structure 20 comprises a semiconductor substrate 21, first conductive regions 23 positioned in the semiconductor substrate 21, second conductive region 25 positioned in the semiconductor substrate 21, vertical double gates 27 positioned in the semiconductor substrate 21 and configured to separate the two first conductive regions 23 from the second conductive region 25, wherein two first conductive regions 23, one second conductive region 25, and the two vertical double gates 27 form an active region 29 of the circuit structure 20.

From a broader perspective, the circuit structure 20 comprises a plurality of the abovementioned units, that is, the active regions 29 that are separated by a plurality of shallow trench isolations (STIs) 22. In FIG. 3, the circuit structure 20 comprises two first conductive regions 23 positioned in two depressions 23', the second conductive region 25 positioned in one depression 25', and the two vertical double gates 27 positioned in two depressions 27' in the substrate 21 and protruding from the surface of the substrate 21. The vertical double gate 27 comprises a bottom conductor 27a, an upper conductor 27b, a first insulating layer 27c, a second insulating layer 27d, and a sidewall spacer 27e. The first insulating layer 27c is positioned at the bottom and the recessed sidewall of the vertical double gate 27, configured to separate the bottom conductor 27a and the upper conductor 27b from the substrate 21, the first conductive regions 23, and the second conductive region 25. The second insulating layer 27d is positioned between the bottom conductor 27a and the upper conductor 27h, configured to separate the bottom conductor 27a and the upper conductor 27b. In FIGS. 3 and 4, the vertical double gate 27 has two long edges 27L and two short edges 27S. The sidewall spacer 27e is positioned on the sidewall of the short edges 27S of the upper conductor 27b, and on the upper sidewall of the long edges 27L of the upper conductor 27b.

According to one embodiment of the present invention, the first conductive region 23 is a source doping region and the second conductive region 25 is a drain doping region. The first conductive region 23 and the second conductive region 25 share a same conductive type (n or p) opposite to that of the substrate 21. Preferably, the bottom conductor 27a and the upper conductor 27b comprise doped polysilicon, in order to be readily integrated with the existing MOS manufacturing technology. The first insulating layer 27c, in one embodiment of the present invention appears in an U shape in a cross sectional view; the second insulating layer 27d, in one embodiment of the present invention appears in a planar shape; and the sidewall spacer 27e comprises insulating materials such as silicon oxide, silicon nitride, silicon oxynitride, or the combination thereof.

Referring to FIG. 2, FIG. 3, and FIG. 4, a first word line pickup 44a configured to electrically interconnect the bottom conductor 27a to a first word line contact 44a'; a second word line pickup 44b configured to electrically interconnect the upper conductor 27b to a second word line contact 44b'; and a bit line pickup (not shown) configured to electrically interconnect either the first conductive regions 23 or the second conductive region 25 to a bit line contact 42. The first word line contact 44a' and the second word line contact 44b' are designed to subject to two external voltages comprising opposite polarities. In one embodiment of the present invention, p-type conductive regions (23, 25) are positioned in the recesses (23', 25') of an n-type substrate 21, and a negative external bias is applied to the first word line contact 44a' while a positive external bias is applied to the second word line contact 44b'. Under the conductive scheme in the preceding embodiment, the negative external bias equal to or larger than the threshold voltage of the circuit structure 20, alone will generate an inversion conducting channel 24 contouring the bottom part of the vertical double gate; whereas the positive external bias alone generate an accumulation of majority carriers situated at proximity of the insulator-substrate interface. Consider the combining effect wherein the two external bias concurrently apply to the vertical double gate, the positive external bias applied on the second conductor negating the effect of the negative external bias applied on the first conductor, therefore, in order to achieve inversion with a gate channel filled with minority carriers, a more negative external bias is required to be applied to the second conductor. In other words, the positive external bias appeared in the embodiment of the present invention plays a pivoting role which is able to modulate the nominal threshold voltage of the circuit structure 20.

For a DRAM structure operated under fixed operating voltages, an introduction of an extra degree of freedom through the application of an additional external bias to one contact of the vertical double gate effectively increase the nominal threshold voltage, and the advantages are categorized in two folds: 1) a higher threshold voltage mitigates the sub-threshold leakage issue in DRAM circuit, and to increase the threshold voltage in this manner avoid the drastic change in the conventional MOS architecture, the replacement of new materials, or the alteration of the fixed operating voltages; 2) an extra degree of freedom is granted in modulating threshold voltage after all the manufacturing process, leaving a wider processing window to achieve the desired reliability.

Referring to FIG. 4, a method for preparing a vertical double gate DRAM structure with vertical contact plugs comprising the steps of a) forming a plurality of STIs (22, 22') in a semiconductor substrate 21; b) forming a rectangular depression 27' in an upper portion of the semiconductor substrate by performing a reactive ion etching (RIE) over a patterned mask with a rectangular opening; c) forming a first insulating layer 27c at least on the bottom and the sidewalls of the depression 27c' by a thermal oxidation process; d) forming a bottom conductor 27a on the first insulating layer 27c at least in the bottom portion of the depression, and an RIE etch back is performed following the deposition of the bottom conductor 27a to achieve a flat surface; e) forming a second insulating layer 27d at least on the surface of the bottom conductor 27a by a thermal oxidation process; f) forming a upper conductor 27b on the second insulating layer 27d to overfill the depression, and an RIE etch back is performed following the deposition of the upper conductor 27b to achieve a flat surface; g) forming two recesses 27R positioned at two ends of the long edge 27L of the upper conductor 27b; h) forming a sidewall spacer 27e positioned in the recesses 27R; i) forming an inter layer dielectric (ILD) 35 on top of the circuit structure 20; j) forming a plurality of vertical trenches on the ILD 35, wherein the longer trenches are positioned on top of the bottom conductor 27a, and the shorter trenches are positioned on top of the upper conductor 27b; and k) filling the trenches with conductive materials, for example, tungsten.

In one embodiment of the present invention, the forming of the rectangular depression 27', or gate trench, in step b) further comprises performing a reactive ion etching (RIB) over a patterned mask with a rectangular opening. Only two complete STIs 22' are shown in FIG. 4, other STIs 22 retaining the bottom portion are consequences of the gate trench etch. Two thermal oxidation processes are performed to form the first and the second insulating layers (27c, 27d). A thermal oxidation leads to coverage of thermal oxide on areas containing silicon, therefore, both the bottom and the long edge 27L sidewalls of the depression 27' are expected to have oxide coverage. Preferably, two chemical vapor deposition (CVD) steps are performed to deposit the bottom and the upper conductor (27a, 27b), and the materials of the conductors (27a, 27b) is polysilicon. An RIE process is conducted after each deposition step to obtain a flat stacking surface. The upper conductor 27b, after the RIE step, has a higher top surface than that of the substrate 21 due to the overfill.

Two recesses 27R positioned at the short edge 27S of the upper conductor 27b are formed by performing an RIE over a patterned mask. The RIE removes not only the conductive materials outside the gate trench, but also the conductive materials positioned at the two ends of the long edge 27L of the upper conductor 27b inside the gate trench. The forming of the two recesses 27R in this step reserves spaces to further accommodate first word line pickups 44a in the subsequent step. The sidewall spacer 27e is deposited by a CVD process. The deposited oxide not situating on the sidewalls of the second conductive stack is further removed by an RIE over a patterned mask. A surface planarization process by flowing an ILD 35 is performed after the sidewall spacer 27e is formed. In the present embodiment, a low melting temperature insulating layer, borophosphosilicate glass, is selected to be the ILD 35. Following the surface planarization, the present embodiment opens four trenches through the thickness of the ILD 35 by an RIB. Two of the trenches have a dimension from the surface of the ILD 35 to the bottom conductor 27a, while the other two trenches have a dimension from the surface of the ILD 35 to the upper conductor 27b. Conductive materials are then sputtered into and overfill the four trenches; a chemical mechanical polishing (CMP) is performed to remove the excessive conductive materials from the top surface of the ILD 35, and finish the final polishing of the circuit structure 20.

Summing up, a DRAM structure with recessed vertical double gate and the method of manufacturing the same are disclosed in the present invention. The recessed vertical double gate structure described above not only mitigate the sub-threshold leakage observed in the conventional DRAM construct but also widen the processing window by introducing an additional degree of freedom controlling the threshold voltage of the device.

Although the present invention and its features have been described in detail, it should be understood that various changes, substitutions, and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit structure, comprising:
   a semiconductor substrate having a depression;
   a first insulating layer positioned on the surface of the depression;
   a bottom conductor positioned in a bottom portion of the depression, wherein the bottom conductor is connected to an external bias through a plurality of longer vertical contact plugs;
   an upper conductor positioned in an upper portion of the depression, wherein the upper conductor is connected to a plurality of shorter vertical contact plugs, and a top surface of the upper conductor is higher than a depression-bearing surface of the semiconductor substrate; and
   a second insulating layer positioned between the bottom conductor and the upper conductor.

2. The circuit structure of claim 1, further comprising:
   a plurality of first conductive regions positioned in the semiconductor substrate; and
   a plurality of second conductive regions positioned in the semiconductor substrate, and the first insulating layer is positioned between the first conductive region and the second conductive region.

3. The circuit structure of claim 2, wherein the first conductive region is a source doping region and the second conductive region is a drain doping region.

4. The circuit structure of claim 1, wherein the bottom conductor and the upper conductor comprise polysilicon.

5. The circuit structure of claim 1, wherein the upper conductor comprises a long edge and a short edge substantially perpendicular to the long edge.

6. The circuit structure of claim 5, further comprising:
   a sidewall spacer positioned on the sidewall of the short edges, and on the sidewall of the long edges above the semiconductor substrate.

7. The circuit structure of claim 6, wherein the first insulating layer, the second insulating layer, and the sidewall spacer comprise a material selected from the group consisting of silicon oxide, silicon nitride, silicon oxynitride, and the combination thereof.

8. The circuit structure of claim 6, wherein the bottom conductor, the upper conductor, the first insulating layer, the second insulating layer, and the sidewall spacer form a vertical double gate.

9. The circuit structure of claim 8, further comprising a channel in the substrate, positioned between the first conductive region and the second conductive region and conforming the shape of the lower half portion of the vertical double gate.

10. The circuit structure of claim 1, wherein the plurality of longer vertical contact plugs connected to the bottom conductor are first word line pickups, configured to electrically interconnect the bottom conductor to first word line contacts.

11. The circuit structure of claim 1, wherein the plurality of shorter vertical contact plugs connected to the upper conductor are second word line pickups, configured to electrically interconnect the upper conductor to second word line contacts.

12. The circuit structure of claim 1, further comprising a bit line pickup, configured to electrically interconnect either the first conductive regions or the second conductive region to a bit line contact.

13. The circuit structure of claim 1, wherein the longer and shorter vertical contact plugs comprise tungsten.

* * * * *